United States Patent [19]
Church et al.

[11] Patent Number: 5,131,992
[45] Date of Patent: Jul. 21, 1992

[54] MICROWAVE INDUCED PLASMA PROCESS FOR PRODUCING TUNGSTEN CARBIDE

[75] Inventors: Ronald H. Church, Birmingham; Johanna B. Salsman, Tuscaloosa; Bobby J. Hamner, Northport, all of Ala.

[73] Assignee: The United States of America, as represented by the Secretary of the Interior, Washington, D.C.

[21] Appl. No.: 704,832

[22] Filed: May 20, 1991

Related U.S. Application Data

[63] Continuation of Ser. No. 461,948, Jan. 8, 1990, abandoned.

[51] Int. Cl.$^5$ .......................... H05H 1/46; B22F 9/14
[52] U.S. Cl. ...................... 204/164; 419/18; 423/440
[58] Field of Search .......................... 204/164; 419/18; 423/440

[56] References Cited

U.S. PATENT DOCUMENTS

| | | | |
|---|---|---|---|
| 3,814,983 | 6/1974 | Weissfloch et al. | 204/164 |
| 4,501,717 | 2/1985 | Tsukamoto et al. | 419/58 |
| 4,680,096 | 7/1987 | Dosaj et al. | 204/164 |
| 4,719,078 | 1/1988 | Miyashita et al. | 419/49 |
| 4,752,456 | 6/1988 | Yoda et al. | 423/440 |
| 4,769,064 | 9/1988 | Buss et al. | 204/164 |

Primary Examiner—John Niebling
Assistant Examiner—Steven P. Marquis
Attorney, Agent, or Firm—E. Philip Koltos

[57] ABSTRACT

A method of heating reactant materials in a plasma chamber to achieve a reaction temperature by enveloping the materials in a microwave induced electric plasma. The plasma chamber positioned in the microwave waveguide is filled with a gas and predetermined quantities of the reactant materials are placed in the chamber or reactor. A microwave produced electric field is passed through the gas to ionize it and produce an electric plasma that envelopes the reactant materials. The process may be used in a variety of high temperature chemical processes such as the production of tungsten carbide.

6 Claims, 1 Drawing Sheet

MICROWAVE INDUCED PLASMA PROCESS FOR PRODUCING TUNGSTEN CARBIDE

This application is a continuation of application Ser. No. 07/461,948, filed Jan. 8, 1990 now abandoned.

TECHNICAL FIELD

This invention relates to high temperatures chemical processes, and more particularly to a microwave induced plasma process for producing products such as tungsten carbide.

BACKGROUND ART

Current commercial processes to form tungsten carbide (WC) involve heating stoichiometrically mixed fine powders of elemental tungsten and carbon in an oven at temperatures of 1500° C. until the reaction:

$$W + C \xrightarrow{heat} WC$$

is complete. This process occurs in approximately six hours. Some commerical processes use electric energy to achieve these temperatures and because of the cost of electricity and the length of time to maintain these high temperatures, this type processing is quite expensive. Even those processes using fossil fuels find that heating an oven to temperatures of 1500° C. can consume large quantities of energy, thus resulting in high processing expenses.

Another disadvantage of the long processing time can be seen in the overall particle size of the tungsten carbide product. It has been determined that shorter reaction time (or shorter time at temperature) reduces grain growth, thus producing a smaller grain size which in turn adds to the overall strength and toughness to the final product.

Those concerned with these and other problems recognize the need for an improved process for producing tungsten carbide.

DISCLOSURE OF THE INVENTION

The present invention provides a process for the production of tungsten carbide which can be formed much more rapidly by utilizing higher temperatures than previously obtained in conventional methods. The invention allows the formation of tungsten carbide in a matter of minutes in a microwave induced plasma (MIP), whereas, it takes several hours to form in industrial furnaces and ovens. Plasma formation is not only a vital step in the reaction of the formation of tungsten carbide, but an absolute essential element for its complete and rapid formation. The utility and field of application of the present invention is not limited to the formation of tungsten carbide alone, but would find a wide variety of applications on the formation of other materials, such as silicon carbide, where silicon carbide is commericially processed in a similar manner as tungsten carbide.

An object of the present invention is the provision of an improved process for producing tungsten carbide by using microwave induced plasma.

Another object is to provide a process that would allow for economically competitive production of tungsten carbide.

A further object of the invention is the provision of a process that would provide tungsten carbide for wear resistant applications.

Still another object is to provide a process where tungsten carbide can be formed in a matter of minutes utilizing the heat from microwave energy.

A still further object of the present invention is the provision of a process that allows the reduction of processing time by a factor of nearly 40.

Yet a further object of the present invention is to provide a process for possible application to other materials.

BRIEF DESCRIPTION OF THE DRAWINGS

These and other attributes of the invention will become more clear upon a thorough study of the following description of the best mode for carrying out the invention, particularly when reviewed in conjunction with the drawings, wherein.

BEST MODE FOR CARRYING OUT THE INVENTION

Figure 1:
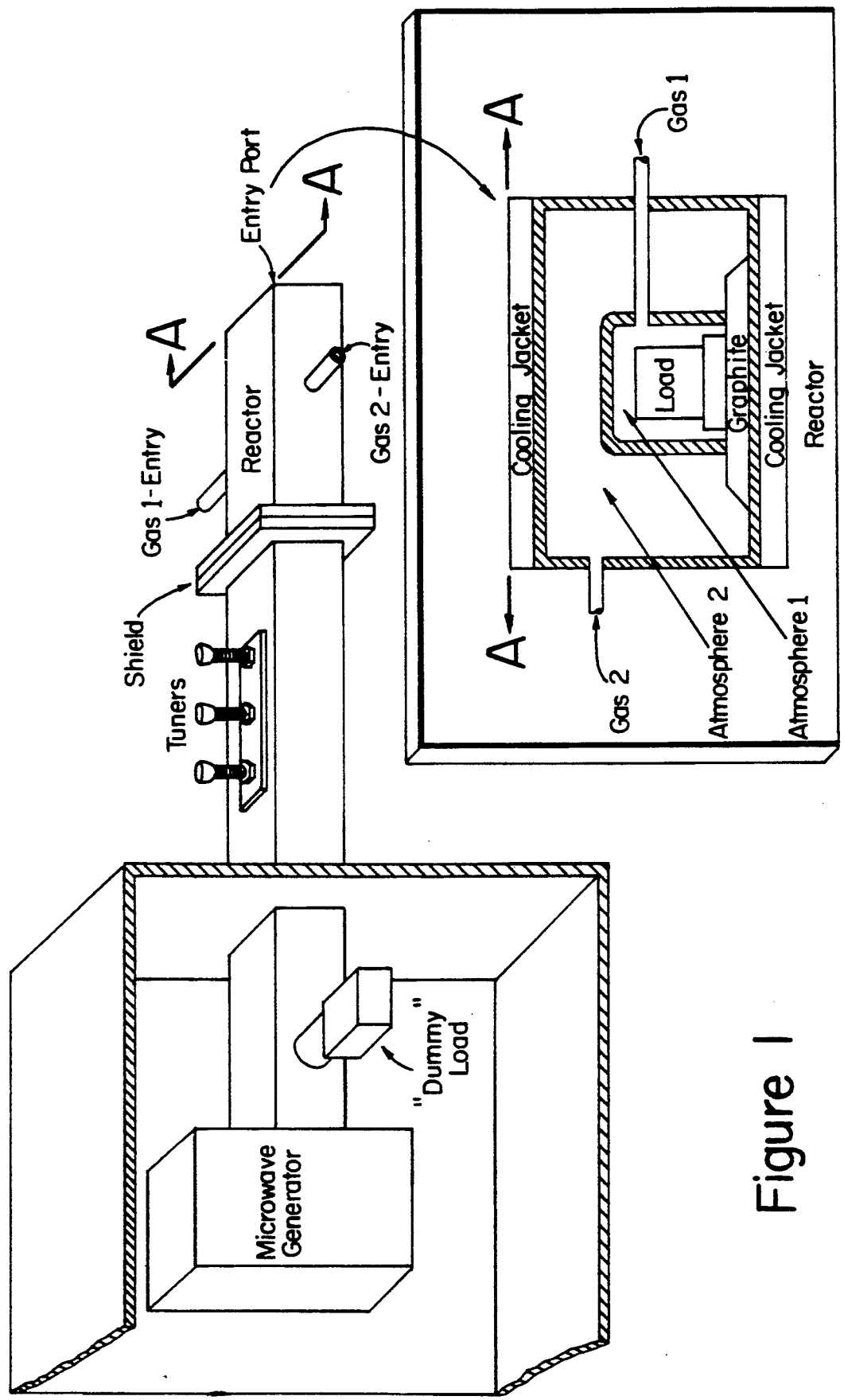
FIG. 1 is a schematic representation of the plasma chamber or reactor inside a microwave waveguide as used in the process of the present invention.

Research was conducted utilizing microwave energy in mineral processing to identify new processes which could benefit the nation's mineral industry. Presently, tungsten carbide is formed by mixing the raw materials of tungsten and carbon powders, and heating this mixture for several hours in furnaces up to temperatures of about 1500° C. In the initial stages of the research, it was determined that microwave energy may be more advantageous than conventional sources to heat the tungsten and carbon powders to form tungsten carbide. It was found that the microwave heating characteristics associated with the raw materials were such that these materials would absorb microwave energy. Conventional microwave heating studies were conducted on the formation of tungsten carbide; however, during each heating test performed, an electric arc would discharge inside the microwave waveguide which in turn would shut down the microwave system. After examination of samples tested under these conditions, it was noted that tungsten carbide had formed on the sample—only in the location associated with the arc. It became apparent that greater possibilities for testing evolved from the high thermal energy released during the arc's occurrence. Instead of experimenting with arc elimination, investigations were initiated into methods for sustaining an arc. It was then discovered that a sustained electric plasma could be created and controlled under the influence of the microwave field, thus creating a MIP. It was then conceived that the use of a MIP for a heat source on the formation of tungsten carbide from its elemental constituents would increase the microwave absorption characteristics of the materials, along with enhancing the reaction because of the complete enveloping of the plasma around the material. Also, this process would utilize the rapid heat (exothermic) developed during the reaction, not to mention that much higher temperatures would be obtainable.

The operation of this invention is based upon the utilization of the heat from a MIP on the following reaction:

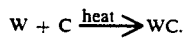

Inside a microwave waveguide, a plasma chamber was constructed. The plasma chamber was filled with a gas such as helium, argon, carbon monoxide, nitrogen, carbon dioxide, etc. The tungsten and carbon sample was placed inside this chamber. The plasma was produced by passing an electric field through the gas in the chamber with a voltage potential high enough to overcome the ionization potential of that gas. Once the gas was ionized the electric plasma was created. The electric field that ionizes the gas was produced by the microwave generator, thus creating a MIP. Because of the construction of the plasma chamber, the plasma totally envelopes the material (see FIG. 1), thus heating the sample uniformly. The heating mechanism is believed to be two-fold: 1) heated conductively through the plasma; and 2) by the microwave energy. These heating mechanisms combined enable the reaction to occur in an unusually short period of time.

EXAMPLE 1

Elemental tungsten and carbon powders with particle sizes of 5 μm or less were mixed in the ratio 93.5 to 6.5 percent by weight. This mixture was then pressed into a pellet shape using a 1 inch diameter die in a hydraulic press at 10,000 psi. Most pellets had a height of 1 to 2 inches. The pellet was then repressed in a 1½ inch diameter die filled with more carbon (on the bottom, around the sides of the pellet, and on top of the pellet) in order that the pellet be completely enveloped with a carbon layer. The amount of excess carbon encapsulating the tungsten and carbon is unessential to the process although some is required due to the loss of carbon during the heating cycle. The gas used for the plasma was carbon monoxide, although several other gases can be used. The industrial sized microwave generator that was used is capable of producing 30 kW of energy at 915 MHz. Any microwave generator which is capable of producing enough energy to sustain an electric plasma can be used. The sample load was placed inside the reactor (see FIG. 1). The inner chamber was filled with CO where the sample was placed, with the outer atmosphere consisting of helium. The microwave generator was then used to ignite and sustain the plasma. The plasma temperature was estimated at approximately 3,000° C. A CO flow rate was maintained at 100 mL/minute with the helium flow rate at approximately 1 L/minute. Flow rates are not critical other than to maintain a positive pressure on the system. The sample remained in the plasma for 10 minutes after which time the plasma was extinguished and the sample left to cool. This process deals with the rapid formation of tungsten carbide from elemental tungsten and carbon powders in a MIP, but is not limited to just this process.

Table 1 shows the particle size distribution for a typical tungsten carbide sample produced in the MIP and, for comparison, a typical sample of tungsten carbide produced by conventional means. As can be seen, the particle size distribution of the MIP sample is much finer than that of the commercial tungsten carbide. This is due to the shorter processing time associated with the MIP process.

TABLE 1

A comparison of the particle size distribution of the tungsten carbide produced in the MIP and conventional heating
The values shown are the percent of particles having diameters less than the indicated size by Microtrac analysis.

| Particle Size (μm) | Distribution, percent | |
| --- | --- | --- |
| | MIP sample | Commercial sample |
| 42.21 | 100 | 100 |
| 29.85 | 100 | 100 |
| 21.10 | 100 | 83 |
| 14.92 | 100 | 57 |
| 10.55 | 100 | 35 |
| 7.46 | 100 | 15 |
| 5.27 | 83 | 8 |
| 3.73 | 69 | 4 |
| 2.63 | 45 | 0 |
| 1.69 | 19 | 0 |
| 1.01 | 7 | 0 |
| .66 | 2 | 0 |
| .43 | 0 | 0 |

LECO analysis of the tungsten carbide product revealed only 0.04 percent free carbon remaining with no oxides present. Commercial quality tungsten carbide requires no more than 0.06 percent free carbon.

This is a MIP reactor. It is to be understood that of microwave generators of various sizes or frequencies can also be used. For example, the microwave generator used in this invention was an industrial 915 MHz, variable power up to 30 kW, microwave generator. Other industrial sized generators operate at 2.45 GHz and have different power ratings. For this particular purpose, a maximum a 7 kW was used, therefore, lower power generators can be substituted.

The process itself is not limited to tungsten carbide. Research has been conducted on the formation of silicon carbide and titanium carbide in the MIP reactor, but more work is required to improve the overall conversions of the compounds. Other carbides, such as the following formations: $B_4C$, $Al_4C_3$, and $TiC$, which also require high temperatures for formation, have been investigated and it is believed they can be processed in this manner also. This process is not limited to carbide formations alone, but may be utilized for heating under reducing conditions and other processes such as smelting.

Other gases can be ionized to form the electric plasma such as argon, helium, butane, carbon monoxide and carbon dioxide. Though each gas produced a stable plasma at different power levels, several variables affect impedance matching. To optimize a plasma, the gas used will be dependent on the waveguide design, desired reaction and the generator frequency. Table 2 gives a list of different gases used and the amount of microwave power absorbed while sustaining a plasma with no load.

TABLE 2

Absorbed microwave power of different gases while sustaining an electric plasma

| Forward Power (W) | Absorbed Power (W) |
| --- | --- |
| Argon | |
| 5,000 | 500 |
| 8,000 | 1,300 |
| 10,000 | 1,300 |
| Carbon monoxide | |
| 5,000 | 700 |
| 8,000 | 1,100 |
| 10,000 | 1,400 |
| Carbon dioxide | |
| 5,000 | 300 |

TABLE 2-continued

Absorbed microwave power of different gases while sustaining an electric plasma

| Forward Power (W) | Absorbed Power (W) |
|---|---|
| 8,000 | 1,100 |
| 10,000 | 1,200 |
| Helium | |
| 5,000 | 700 |
| 8,000 | 1,100 |
| 10,000 | 1,400 |
| Butane | |
| 5,000 | 500 |
| 8,000 | 900 |
| 10,000 | 1,000 |

Advantages of this process over prior or current processes is that tungsten carbide can be formed in a matter of minutes utilizing the heat from microwave energy, the electric plasma, and the heat reaction from its exothermic properties where it takes hours through conventional processing. Conventional methods of producing tungsten carbide usually requires about six hours of heating; two hours to reach a temperature of 1500° C., two hours at this temperature, and two hours to cool down. A preliminary comparison of the energy costs have been calculated where the assumptions were made that the heat loss from both methods was by convection so that it was proportional to the difference in oven and ambient temperatures and that the oven coefficients are the same. Also, it was assumed that heat loss from the oven was the major energy use and was large compared to the heat required to raise the sample temperature so that the latter could be neglected. From these calculations, it was found that the MIP process on the formation of tungsten carbide only requires 13 percent of the energy to form tungsten carbide by conventional heating. Analysis of the capital and energy cost associated with the production of tungsten carbide through the MIP indicates that it is likely that the process can be developed to be economically competitive with conventional methods. Although capital equipment costs for a microwave oven with the same capacity as a conventional oven will be high, this will be compensated by energy savings. Furthermore, the reduction of processing time by a factor of nearly 40 means that the microwave oven needs only two to three percent of the capacity of the conventional oven in order to achieve the same throughput.

A feature of this invention is the ability to produce tungsten carbide powder through a MIP. Because this is not a flow-through process, the plasma can be contained in a closed system for extended periods of time (time at temperature). This also allows for the utilization of the exothermic heat for the reaction of the tungsten and carbon.

Thus, it can be seen that at least all of the stated objectives have been achieved.

Obviously, many modifications and variations of the present invention are possible in light of the above teachings. It is therefore to be understood that, within the scope of the appended claims, the invention may be practised otherwise than as specifically described.

We claim:

1. A method of rapidly producing tungsten carbide particles in a microwave induced plasma to provide a higher distribution of particle sizes wherein one hundred percent of the particles are less than 7.46 μm, 83 percent of the particles are less than 5.27 μm, 69 percent of the particles are less than 3.73 μm, 45 percent of the particles are less than 2.63 μm, 19 percent of the particles are less than 1.69 μm, 7 percent of the particles are less than 1.01 μm, and 2 percent of the particles are less than 0.66 μm, comprising:

filling a plasma chamber with a gas selected from argon, carbon monoxide, carbon dioxide, helium and butane;

charging a mixture of tungsten and carbon powders into the plasma chamber;

passing a microwave produced electric field through the gas to ionize the gas and produce a microwave induced electric plasma to uniformly envelop the powders and cause the powders to react and yield a resultant tungsten carbide product.

2. The method of claim 1 wherein envelopment of the powders includes heating the powders conductively through the electric plasma.

3. The method of claim 1 wherein envelopment of the powders includes heating the powders by absorption of microwave energy.

4. The method of claim 1 wherein the gas is carbon monoxide.

5. The method of claim 4 wherein the tungsten is present in an amount of about 93.5 weight percent, and carbon is present in an amount of about 6.5 weight percent.

6. The method of claim 5 wherein said carbon monoxide is provided at a flow rate sufficient to maintain a positive pressure in the plasma chamber.

* * * * *